United States Patent
Wang et al.

(10) Patent No.: US 11,447,855 B2
(45) Date of Patent: Sep. 20, 2022

(54) HARD COATING AND HARD-COATING-COVERED MEMBER

(71) Applicant: OSG CORPORATION, Toyokawa (JP)

(72) Inventors: Mei Wang, Toyokawa (JP); Hiroaki Sugita, Toyokawa (JP)

(73) Assignee: OSG CORPORATION, Toyokawa (JP)

( * ) Notice: Subject to any disclaimer, the term of this patent is extended or adjusted under 35 U.S.C. 154(b) by 52 days.

(21) Appl. No.: 17/262,172

(22) PCT Filed: Aug. 1, 2018

(86) PCT No.: PCT/JP2018/028938
§ 371 (c)(1),
(2) Date: Jan. 21, 2021

(87) PCT Pub. No.: WO2020/026389
PCT Pub. Date: Feb. 6, 2020

(65) Prior Publication Data
US 2021/0292885 A1    Sep. 23, 2021

(51) Int. Cl.
*B23B 27/14*    (2006.01)
*C23C 14/06*    (2006.01)
(Continued)

(52) U.S. Cl.
CPC ........ *C23C 14/0641* (2013.01); *B23B 27/148* (2013.01); *C23C 14/325* (2013.01);
(Continued)

(58) Field of Classification Search
CPC ..... B23B 27/14; C23C 14/0641; C23C 28/42; C23C 28/44
(Continued)

(56) References Cited

U.S. PATENT DOCUMENTS

2006/0068225 A1 * 3/2006 Yamamoto ............ C23C 28/042
204/192.16
2006/0222893 A1   10/2006 Derflinger
(Continued)

FOREIGN PATENT DOCUMENTS

JP    2002-337007 A    11/2002
JP    2004-238736    *   8/2004
(Continued)

OTHER PUBLICATIONS

Oct. 23, 2018 International Search Report issued in International Patent Application No. PCT/JP2018/028938.
(Continued)

*Primary Examiner* — Archene A Turner
(74) *Attorney, Agent, or Firm* — Oliff PLC

(57) ABSTRACT

A hard coating includes three kinds of alternately laminated layers. The three kinds of layers consist of two kinds of single composition layers and a nanolayer-alternated layer. The two kinds of single composition layers are constituted by respective two of an A composition, a B composition and a C composition, wherein the A composition is a nitride of AlCrα, the B composition is a nitride of AlCrSiβ, and the C composition is a nitride of AlCr(SiC)γ. The nanolayer-alternated layer includes two kinds of nanolayers which are constituted by respective two of the A composition, the B composition and the C composition and which are alternately laminated. Each of the two kinds of single composition layers has a thickness of 0.5-1000 nm. Each of the two kinds of nanolayers has a thickness of 0.5-500 nm, and the nanolayer-alternated layer has a thickness of 1-1000 nm.

7 Claims, 10 Drawing Sheets

(51) Int. Cl.
 *C23C 14/32* (2006.01)
 *C23C 28/04* (2006.01)
 *C23C 28/00* (2006.01)
(52) U.S. Cl.
 CPC ............ *C23C 28/044* (2013.01); *C23C 28/42* (2013.01); *C23C 28/44* (2013.01)
(58) Field of Classification Search
 USPC .......................................... 428/697, 698, 699
 See application file for complete search history.

(56) References Cited

U.S. PATENT DOCUMENTS

| | | | |
|---|---|---|---|
| 2008/0131726 A1 | 6/2008 | Derflinger | |
| 2008/0229891 A1* | 9/2008 | Lechthaler | C23C 14/0641 83/13 |
| 2008/0233374 A1* | 9/2008 | Lechthaler | C23C 28/042 427/255.15 |
| 2009/0136727 A1* | 5/2009 | Yamamoto | C23C 28/42 428/213 |
| 2010/0012483 A1 | 1/2010 | Derflinger | |
| 2010/0215912 A1* | 8/2010 | Kubota | C23C 14/325 428/332 |
| 2011/0117344 A1* | 5/2011 | Chen | C23C 14/0641 501/98.4 |
| 2015/0072126 A1* | 3/2015 | Sakurai | C23C 28/321 428/216 |
| 2016/0193662 A1 | 7/2016 | Park et al. | |
| 2017/0129818 A1 | 5/2017 | Nii et al. | |
| 2017/0152602 A1* | 6/2017 | Abe | C23C 30/005 |
| 2018/0099335 A1 | 4/2018 | Takeshita et al. | |
| 2018/0243837 A1* | 8/2018 | Sakurai | C23C 28/044 |
| 2018/0251884 A1 | 9/2018 | Sakurai et al. | |
| 2019/0249311 A1* | 8/2019 | Sakurai | C23C 28/027 |

FOREIGN PATENT DOCUMENTS

| | | | |
|---|---|---|---|
| JP | 2007-030132 A | | 2/2007 |
| JP | 200-173756 | * | 7/2008 |
| JP | 2008-534297 A | | 8/2008 |
| JP | 2011-094241 | * | 5/2011 |
| JP | 2012-035378 A | | 2/2012 |
| JP | 2014-079834 A | | 5/2014 |
| JP | 2016-014166 A | | 1/2016 |
| JP | 2017-177239 A | | 10/2017 |
| WO | 2010/150411 A1 | | 12/2010 |
| WO | 2017/037956 A1 | | 3/2017 |

OTHER PUBLICATIONS

Hovsepian et al., "CrAlYN/CrN superlattice coatings deposited by the combined high power impulse magnetron sputtering/unbalanced magnetron sputtering technique", Surface & Coatings Technology, 201, pp. 4105-4110 (2006).

* cited by examiner

FIG.10

| COMPOSITION | A COMPOSITION (at%) | | | | | | | | | | | | |
|---|---|---|---|---|---|---|---|---|---|---|---|---|---|
| | Al | Cr | B | C | Ti | V | Y | Zr | Nb | Mo | Hf | Ta | W |
| TEST SAMPLE 1 | 86 | 14 | | | | | | | | | | | |
| TEST SAMPLE 2 | 29 | 71 | | | | | | | | | | | |
| TEST SAMPLE 3 | 95 | 5 | | | | | | | | | | | |
| TEST SAMPLE 4 | 88 | 12 | | | | | | | | | | | |
| TEST SAMPLE 5 | 20 | 80 | | | | | | | | | | | |
| TEST SAMPLE 6 | 92 | 8 | | | | | | | | | | | |
| TEST SAMPLE 7 | 85 | 15 | | | | | | | | | | | |
| TEST SAMPLE 8 | 77.1 | 22.9 | | | | | | | | | | | |
| TEST SAMPLE 9 | 75.3 | 24.7 | | | | | | | | | | | |
| TEST SAMPLE 10 | 69.9 | 30.1 | | | | | | | | | | | |
| TEST SAMPLE 11 | 55.3 | 44.7 | | | | | | | | | | | |
| TEST SAMPLE 12 | 49.2 | 40.8 | | | | | | | | | | | 10 |
| TEST SAMPLE 13 | 30 | 70 | | | | | | | | | | | |
| TEST SAMPLE 14 | 30 | 64.9 | | | 5.1 | | | | | | | | |
| TEST SAMPLE 15 | 40.4 | 59 | | | | | | | 0.6 | | | | |
| TEST SAMPLE 16 | 58.8 | 41.2 | | | | | | | | | | | |
| TEST SAMPLE 17 | 68.9 | 31.1 | | | | | | | | | | | |
| TEST SAMPLE 18 | 49.2 | 50.8 | | | | | | | | | | | |
| TEST SAMPLE 19 | 55.9 | 44.1 | | | | | | | | | | | |
| TEST SAMPLE 20 | 64.3 | 33.4 | 2.3 | | | | | | | | | | |
| TEST SAMPLE 21 | 75 | 15 | 10 | | | | | | | | | | |
| TEST SAMPLE 22 | 84.8 | 15 | 0.2 | | | | | | | | | | |
| TEST SAMPLE 23 | 55.7 | 40.2 | 4.1 | | | | | | | | | | |
| TEST SAMPLE 24 | 60.9 | 33.4 | | 5.7 | | | | | | | | | |
| TEST SAMPLE 25 | 72.3 | 20.3 | | 7.4 | | | | | | | | | |
| TEST SAMPLE 26 | 75.3 | 15 | 5 | 4.7 | | | | | | | | | |
| TEST SAMPLE 27 | 79.1 | 19.8 | | | 1.1 | | | | | | | | |
| TEST SAMPLE 28 | 60.1 | 34.5 | | | 5.4 | | | | | | | | |
| TEST SAMPLE 29 | 40 | 50 | | | 10 | | | | | | | | |
| TEST SAMPLE 30 | 55.8 | 44.1 | | | 0.1 | | | | | | | | |
| TEST SAMPLE 31 | 56.3 | 35.9 | 3.5 | | 4.3 | | | | | | | | |
| TEST SAMPLE 32 | 47.9 | 44.5 | | | | 7.6 | | | | | | | |
| TEST SAMPLE 33 | 80 | 15.5 | | | | 4.5 | | | | | | | |
| TEST SAMPLE 34 | 54.3 | 36.3 | | 5 | | 4.4 | | | | | | | |
| TEST SAMPLE 35 | 83.4 | 15 | | | | | 1.6 | | | | | | |
| TEST SAMPLE 36 | 60.9 | 35.4 | | | | | 3.7 | | | | | | |
| TEST SAMPLE 37 | 70.2 | 20 | | | 5 | | 4.8 | | | | | | |
| TEST SAMPLE 38 | 72.3 | 17.7 | | | | | | | 10 | | | | |
| TEST SAMPLE 39 | 40.6 | 55.3 | | | | | | | 4.1 | | | | |
| TEST SAMPLE 40 | 80 | 19.9 | | | | | | | 0.1 | | | | |
| TEST SAMPLE 41 | 70.3 | 22.4 | 5 | | | | | | 2.3 | | | | |
| TEST SAMPLE 42 | 66.9 | 29.1 | | | | | | | | 4 | | | |
| TEST SAMPLE 43 | 60.7 | 29.9 | | | | | | | | 9.4 | | | |
| TEST SAMPLE 44 | 70.3 | 19.7 | | | | | | 3.5 | | 6.5 | | | |
| TEST SAMPLE 45 | 40 | 50 | | | | | | | | | 10 | | |
| TEST SAMPLE 46 | 44.1 | 49.3 | 2.5 | | | | | | | | 4.1 | | |
| TEST SAMPLE 47 | 55.4 | 35.5 | | | | | | | | | | 9.1 | |
| TEST SAMPLE 48 | 69.7 | 20.9 | | | 5.5 | | | | | | | 3.9 | |
| TEST SAMPLE 49 | 30 | 65 | | | | | | | | | | | 5 |
| TEST SAMPLE 50 | 58.3 | 31.7 | | | | | | | 5 | | | | 5 |

FIG.11

| COMPOSITION | B COMPOSITION (at%) | | | | | | | | | | | | | |
|---|---|---|---|---|---|---|---|---|---|---|---|---|---|---|
| | Al | Cr | Si | B | C | Ti | V | Y | Zr | Nb | Mo | Hf | Ta | W |
| TEST SAMPLE 1 | 90 | 10 | | | | | | | | | | | | |
| TEST SAMPLE 2 | 85.1 | 9 | 5.9 | | | | | | | | | | | |
| TEST SAMPLE 3 | 19.5 | 51.5 | 29 | | | | | | | | | | | |
| TEST SAMPLE 4 | 88 | 9.9 | 2.1 | | | | | | | | | | | |
| TEST SAMPLE 5 | 19.5 | 35.2 | 45.3 | | | | | | | | | | | |
| TEST SAMPLE 6 | 35.1 | 50.5 | 14.4 | | | | | | | | | | | |
| TEST SAMPLE 7 | 85 | 10 | 5 | | | | | | | | | | | |
| TEST SAMPLE 8 | 65 | 17 | 13 | 5 | | | | | | | | | | |
| TEST SAMPLE 9 | 20 | 25 | 45 | | | | | | 10 | | | | | |
| TEST SAMPLE 10 | 35.9 | 50 | 14.1 | | | | | | | | | | | |
| TEST SAMPLE 11 | 44.5 | 50 | 5.5 | | | | | | | | | | | |
| TEST SAMPLE 12 | 53.2 | 15.6 | 31.2 | | | | | | | | | | | |
| TEST SAMPLE 13 | 55.7 | 25.2 | 19.1 | | | | | | | | | | | |
| TEST SAMPLE 14 | 63.4 | 30.7 | 3.9 | | | | 2 | | | | | | | |
| TEST SAMPLE 15 | 69.5 | 15.3 | 15.2 | | | | | | | | | | | |
| TEST SAMPLE 16 | 75.3 | 21.7 | 3 | | | | | | | | | | | |
| TEST SAMPLE 17 | 63.4 | 23.3 | 13.3 | | | | | | | | | | | |
| TEST SAMPLE 18 | 25.8 | 50 | 24.2 | | | | | | | | | | | |
| TEST SAMPLE 19 | 67.1 | 23.3 | 7.7 | 1.9 | | | | | | | | | | |
| TEST SAMPLE 20 | 59.9 | 33.4 | 3 | 3.7 | | | | | | | | | | |
| TEST SAMPLE 21 | 53.9 | 30.1 | 6 | 10 | | | | | | | | | | |
| TEST SAMPLE 22 | 44.9 | 10 | 45 | | 0.1 | | | | | | | | | |
| TEST SAMPLE 23 | 60.3 | 33.4 | 3.3 | | 3 | | | | | | | | | |
| TEST SAMPLE 24 | 23.9 | 49.3 | 22.3 | | 4.5 | | | | | | | | | |
| TEST SAMPLE 25 | 39.3 | 45.1 | 6.3 | 5 | 4.3 | | | | | | | | | |
| TEST SAMPLE 26 | 80.5 | 10.3 | 5 | | | 4.2 | | | | | | | | |
| TEST SAMPLE 27 | 85 | 11 | 3 | | | 1 | | | | | | | | |
| TEST SAMPLE 28 | 70.3 | 22.2 | 3.5 | | | 4 | | | | | | | | |
| TEST SAMPLE 29 | 63.9 | 20.2 | 7.5 | 1 | | 7.4 | | | | | | | | |
| TEST SAMPLE 30 | 53.4 | 35.3 | 8.9 | | | | 2.4 | | | | | | | |
| TEST SAMPLE 31 | 45.6 | 44.9 | 3.5 | | | | 6 | | | | | | | |
| TEST SAMPLE 32 | 42.3 | 39.9 | 7.8 | | | | 10 | | | | | | | |
| TEST SAMPLE 33 | 55.3 | 21.2 | 14.5 | | 3.5 | | 5.5 | | | | | | | |
| TEST SAMPLE 34 | 44.6 | 37.1 | 8.5 | | | | | 9.8 | | | | | | |
| TEST SAMPLE 35 | 54.9 | 40 | 3 | | | | | 2.1 | | | | | | |
| TEST SAMPLE 36 | 62.2 | 28.7 | 9 | | | | | 0.1 | | | | | | |
| TEST SAMPLE 37 | 60 | 19.9 | 15.5 | | | 3.2 | | 1.4 | | | | | | |
| TEST SAMPLE 38 | 65.3 | 23.3 | 4.9 | | | | | | 6.5 | | | | | |
| TEST SAMPLE 39 | 70.7 | 19.2 | 3.5 | | | | | | 6.6 | | | | | |
| TEST SAMPLE 40 | 73.2 | 15.1 | 6.7 | | | | | | 5 | | | | | |
| TEST SAMPLE 41 | 60.1 | 22.2 | 9.1 | | 3.2 | | 3.5 | | 1.9 | | | | | |
| TEST SAMPLE 42 | 79.2 | 13.4 | 6.7 | | | | | | | 0.7 | | | | |
| TEST SAMPLE 43 | 84.4 | 10.1 | 3.5 | | | | | | | 2 | | | | |
| TEST SAMPLE 44 | 50.2 | 23.3 | 17.3 | 2.3 | | 3.3 | | | | | 3.6 | | | |
| TEST SAMPLE 45 | 43.8 | 32.2 | 14.5 | | | | | | | | 9.5 | | | |
| TEST SAMPLE 46 | 44.4 | 35.7 | 10 | | | 3.5 | | | 2.5 | | 3.9 | | | |
| TEST SAMPLE 47 | 59.7 | 23.4 | 14.5 | | | | | | | | | 2.4 | | |
| TEST SAMPLE 48 | 62.2 | 13.9 | 14.2 | 2.5 | | | | | 3.5 | | | 3.7 | | |
| TEST SAMPLE 49 | 85 | 10 | 3 | | | | | | | | | | | 2 |
| TEST SAMPLE 50 | 70.3 | 12.9 | 6.8 | | 3.5 | | | | | 4.2 | | | | 2.3 |

FIG.12

| COMPOSITION | C COMPOSITION (at%) | | | | | | | | | | | | | |
|---|---|---|---|---|---|---|---|---|---|---|---|---|---|---|
| | Al | Cr | SiC | B | C | Ti | V | Y | Zr | Nb | Mo | Hf | Ta | W |
| TEST SAMPLE 1 | 86 | 9 | 5 | | | | | | | | | | | |
| TEST SAMPLE 2 | 19.5 | 50 | 30.5 | | | | | | | | | | | |
| TEST SAMPLE 3 | 19.9 | 9 | 71.1 | | | | | | | | | | | |
| TEST SAMPLE 4 | 88.5 | 9 | 2.5 | | | | | | | | | | | |
| TEST SAMPLE 5 | 35 | 51.1 | 13.9 | | | | | | | | | | | |
| TEST SAMPLE 6 | 15.7 | 34.5 | 49.8 | | | | | | | | | | | |
| TEST SAMPLE 7 | 85 | 10 | 5 | | | | | | | | | | | |
| TEST SAMPLE 8 | 80.4 | 16.6 | 3 | | | | | | | | | | | |
| TEST SAMPLE 9 | 38.5 | 50 | 3 | | | | | | | | 8.5 | | | |
| TEST SAMPLE 10 | 68.7 | 10.5 | 18.2 | | | | | 2.6 | | | | | | |
| TEST SAMPLE 11 | 64.5 | 30.9 | 4.6 | | | | | | | | | | | |
| TEST SAMPLE 12 | 54.4 | 41.9 | 3.7 | | | | | | | | | | | |
| TEST SAMPLE 13 | 44.9 | 50 | 5.1 | | | | | | | | | | | |
| TEST SAMPLE 14 | 37.9 | 35.4 | 26.7 | | | | | | | | | | | |
| TEST SAMPLE 15 | 30.5 | 21.4 | 45 | | | | 3.1 | | | | | | | |
| TEST SAMPLE 16 | 20 | 48.3 | 31.7 | | | | | | | | | | | |
| TEST SAMPLE 17 | 40.9 | 22.3 | 36.8 | | | | | | | | | | | |
| TEST SAMPLE 18 | 44.5 | 33.4 | 22.1 | | | | | | | | | | | |
| TEST SAMPLE 19 | 44.9 | 35.2 | 19.9 | | | | | | | | | | | |
| TEST SAMPLE 20 | 55.3 | 23.3 | 21.4 | | | | | | | | | | | |
| TEST SAMPLE 21 | 59.6 | 32.3 | 8.1 | | | | | | | | | | | |
| TEST SAMPLE 22 | 65.9 | 19.3 | 14.8 | | | | | | | | | | | |
| TEST SAMPLE 23 | 60.4 | 20.9 | 12.9 | 5.8 | | | | | | | | | | |
| TEST SAMPLE 24 | 59.3 | 33.1 | 5.4 | 2.2 | | | | | | | | | | |
| TEST SAMPLE 25 | 20 | 50 | 20 | | 10 | | | | | | | | | |
| TEST SAMPLE 26 | 35.5 | 44.1 | 20.2 | | 0.2 | | | | | | | | | |
| TEST SAMPLE 27 | 50.3 | 35.3 | 5.9 | 2.5 | 6.0 | | | | | | | | | |
| TEST SAMPLE 28 | 57.5 | 30.9 | 7.2 | | | 4.4 | | | | | | | | |
| TEST SAMPLE 29 | 55.6 | 10.0 | 33.2 | | | 1.2 | | | | | | | | |
| TEST SAMPLE 30 | 67.7 | 19 | 11.3 | | | 2 | | | | | | | | |
| TEST SAMPLE 31 | 66 | 20.0 | 4 | | | 10 | | | | | | | | |
| TEST SAMPLE 32 | 54.4 | 33.4 | 3 | 2.5 | | 6.7 | | | | | | | | |
| TEST SAMPLE 33 | 43.4 | 38.9 | 8.5 | | | | 9.2 | | | | | | | |
| TEST SAMPLE 34 | 35.4 | 40.2 | 14.4 | | | | 5 | 5 | | | | | | |
| TEST SAMPLE 35 | 57.9 | 15.3 | 25.5 | | | | | | 1.3 | | | | | |
| TEST SAMPLE 36 | 55.3 | 19.3 | 15.4 | | | | 7.5 | 2.5 | | | | | | |
| TEST SAMPLE 37 | 59.3 | 30.2 | 9.5 | | | | | | | 1 | | | | |
| TEST SAMPLE 38 | 44.5 | 42.1 | 3.4 | | | | | | | 10 | | | | |
| TEST SAMPLE 39 | 29.2 | 50 | 12.4 | | | | 3.5 | | | 4.9 | | | | |
| TEST SAMPLE 40 | 38.8 | 44.4 | 10 | | | | | | | | 6.8 | | | |
| TEST SAMPLE 41 | 36.9 | 44.1 | 9.9 | | | 8.2 | | | | | 0.9 | | | |
| TEST SAMPLE 42 | 57.7 | 17.9 | 15.2 | | | | | | 4.5 | | 4.7 | | | |
| TEST SAMPLE 43 | 40.2 | 40.1 | 10.2 | | | | | | | | | 9.5 | | |
| TEST SAMPLE 44 | 54.1 | 23.4 | 20.4 | | | | | | | | | 2.1 | | |
| TEST SAMPLE 45 | 50.3 | 18.3 | 21.4 | | | | | | | 5.4 | | 4.6 | | |
| TEST SAMPLE 46 | 37.1 | 50 | 3 | | | | | | | | | | 9.9 | |
| TEST SAMPLE 47 | 44.3 | 20.2 | 27.7 | | | 3.5 | 2.1 | | | | | | 2.2 | |
| TEST SAMPLE 48 | 57.7 | 30.5 | 5.6 | | | | | | | | | | | 6.2 |
| TEST SAMPLE 49 | 50.3 | 34.5 | 7.9 | | 2.5 | 3.4 | | | | | | | | 1.4 |
| TEST SAMPLE 50 | 62.8 | 20.3 | 6.9 | 3.2 | | 2.5 | | | | | | 3.3 | | 1.0 |

FIG.13

| COATING STRUCTURE | SINGLE COMPOSITION LAYER | | | NANOLAYER-ALTERNATED LAYER | | | | | TOTAL NUMBER OF SETS OF LAYERS | INTER-FACE LAYER (nm) | TOTAL THICK-NESS (μm) |
|---|---|---|---|---|---|---|---|---|---|---|---|
| | A LAYER (nm) | B LAYER (nm) | C LAYER (nm) | A LAYER (nm) | B LAYER (nm) | C LAYER (nm) | NUMBER OF PAIRS OF LAMINATED LAYERS | ALTER-NATED LAYER THICK-NESS (nm) | | | |
| TEST SAMPLE 1 | 0.4 | 0.1 | | 0.2 | 0.1 | | 1 | 0.3 | 451 | 8 | 0.4 |
| TEST SAMPLE 2 | 1100 | 1500 | | 550 | 540 | | 2 | 2180 | 5 | 30 | 23.9 |
| TEST SAMPLE 3 | 0.3 | | 300 | 0.2 | | 0.3 | 1 | 0.5 | 16 | 40 | 4.8 |
| TEST SAMPLE 4 | 80 | | 0.3 | 510 | | 520 | 1 | 1030 | 15 | 1200 | 17.9 |
| TEST SAMPLE 5 | | 1200 | 0.6 | | 40 | 0.3 | 25 | 1008 | 11 | 40 | 24.3 |
| TEST SAMPLE 6 | | 0.3 | 0.4 | | 501 | 600 | 1 | 1101 | 3 | 10 | 3.3 |
| TEST SAMPLE 7 | 0.5 | 0.5 | | 0.5 | 0.5 | | 1 | 1 | 200 | 50 | 0.5 |
| TEST SAMPLE 8 | 400 | 250 | | 50 | 105 | | 5 | 775 | 12 | 100 | 17.2 |
| TEST SAMPLE 9 | 500 | 230 | | 100 | 50 | | 3 | 450 | 16 | 1000 | 19.9 |
| TEST SAMPLE 10 | 700 | 100 | | 8 | 10 | | 20 | 360 | 5 | 500 | 6.3 |
| TEST SAMPLE 11 | 1000 | 300 | | 20 | 60 | | 12 | 960 | 3 | 800 | 7.6 |
| TEST SAMPLE 12 | 330 | 300 | | 300 | 200 | | 2 | 1000 | 2 | 280 | 3.2 |
| TEST SAMPLE 13 | 100 | 180 | | 25 | 25 | | 8 | 400 | 6 | 90 | 4.2 |
| TEST SAMPLE 14 | 25 | 15 | | 2.5 | 0.5 | | 19 | 57 | 5 | 550 | 1.0 |
| TEST SAMPLE 15 | 30 | 50 | | 5 | 1 | | 15 | 90 | 20 | 350 | 3.8 |
| TEST SAMPLE 16 | 20 | 35 | | 9 | 10 | | 5 | 95 | 18 | 200 | 2.9 |
| TEST SAMPLE 17 | 2 | 10 | | 4 | 6 | | 1 | 10 | 195 | 850 | 5.1 |
| TEST SAMPLE 18 | 250 | 150 | | 20 | 10 | | 3 | 90 | 15 | 150 | 7.5 |
| TEST SAMPLE 19 | 50 | 200 | | 10 | 5 | | 9 | 135 | 5 | 90 | 2.0 |
| TEST SAMPLE 20 | 415 | | 250 | 500 | 500 | | 1 | 1000 | 3 | 10 | 5.0 |
| TEST SAMPLE 21 | 600 | | 450 | 50 | | 150 | 3 | 600 | 10 | 100 | 16.6 |
| TEST SAMPLE 22 | 1000 | | 1000 | 500 | | 450 | 1 | 950 | 3 | 150 | 9.0 |
| TEST SAMPLE 23 | 910 | | 480 | 440 | | 500 | 1 | 940 | 3 | 300 | 7.3 |
| TEST SAMPLE 24 | 450 | | 500 | 340 | | 250 | 1 | 590 | 3 | 240 | 4.9 |
| TEST SAMPLE 25 | 320 | | 200 | 190 | | 120 | 3 | 930 | 3 | 150 | 4.5 |
| TEST SAMPLE 26 | 90 | | 50 | 10 | | 5 | 10 | 150 | 16 | 1000 | 5.6 |
| TEST SAMPLE 27 | 250 | | 180 | 50 | | 25 | 12 | 900 | 15 | | 20.0 |
| TEST SAMPLE 28 | 280 | | 900 | 400 | | 100 | 2 | 1000 | 3 | 400 | 6.9 |
| TEST SAMPLE 29 | 0.5 | | 1.5 | 1 | | 1 | 1 | 2 | 100 | 100 | 0.5 |
| TEST SAMPLE 30 | 15 | | 30 | 5 | | 5 | 6 | 60 | 24 | 530 | 3.1 |
| TEST SAMPLE 31 | 8 | | 12 | 10 | | 2 | 3 | 36 | 75 | 590 | 4.8 |
| TEST SAMPLE 32 | 800 | | 200 | 200 | | 80 | 3 | 840 | 10 | 1000 | 19.4 |
| TEST SAMPLE 33 | 30 | | 30 | 15 | | 10 | 6 | 150 | 3 | 350 | 1.0 |
| TEST SAMPLE 34 | 50 | | 50 | 9 | | 6 | 15 | 225 | 7 | 450 | 2.7 |
| TEST SAMPLE 35 | 100 | | 50 | 15 | | 12 | 8 | 216 | 9 | 2 | 3.3 |
| TEST SAMPLE 36 | | 1 | 1 | | 0.5 | 0.5 | 1 | 1 | 1000 | 630 | 3.6 |
| TEST SAMPLE 37 | | 2 | 3 | | 2 | 1 | 2 | 6 | 330 | 1000 | 4.6 |
| TEST SAMPLE 38 | | 5 | 5 | | 5 | 5 | 2 | 20 | 60 | 650 | 2.5 |
| TEST SAMPLE 39 | | 60 | 40 | | 40 | 20 | 3 | 180 | 8 | 1000 | 3.2 |
| TEST SAMPLE 40 | | 90 | 130 | | 100 | 80 | 2 | 360 | 10 | 500 | 6.3 |
| TEST SAMPLE 41 | | 100 | 200 | | 50 | 30 | 5 | 400 | 5 | 850 | 4.4 |
| TEST SAMPLE 42 | | 2 | 2 | | 2 | 2 | 2 | 8 | 160 | 890 | 2.8 |
| TEST SAMPLE 43 | | 50 | 35 | | 15 | 25 | 4 | 160 | 6 | 1000 | 2.5 |
| TEST SAMPLE 44 | | 150 | 100 | | 60 | 120 | 2 | 360 | 7 | 500 | 4.8 |
| TEST SAMPLE 45 | | 700 | 350 | | 200 | 200 | 1 | 400 | 5 | | 7.3 |
| TEST SAMPLE 46 | | 15 | 5 | | 3 | 3 | 4 | 24 | 22 | 600 | 1.6 |
| TEST SAMPLE 47 | | 1000 | 600 | | 500 | 500 | 1 | 1000 | 7 | 810 | 19.0 |
| TEST SAMPLE 48 | | 50 | 100 | | 15 | 20 | 5 | 175 | 15 | 840 | 5.7 |
| TEST SAMPLE 49 | | 100 | 5 | | 5 | 3 | 3 | 24 | 6 | 660 | 1.4 |
| TEST SAMPLE 50 | | 0.5 | 0.5 | | 0.5 | 0.5 | 1 | 1 | 2400 | 950 | 5.8 |

FIG.14

| RESULT | COATING HARDNESS HV0.025 | WEAR WIDTH (mm) | CUTTING DISTANCE (m) | EVALUATION | REMARK |
|---|---|---|---|---|---|
| TEST SAMPLE 1 | 2210 | 0.399 | 330 | × | COMPARATIVE PRODUCT |
| TEST SAMPLE 2 | 2670 | 0.365 | 450 | × | COMPARATIVE PRODUCT |
| TEST SAMPLE 3 | 2560 | 0.360 | 279 | × | COMPARATIVE PRODUCT |
| TEST SAMPLE 4 | 2060 | 0.335 | 329 | × | COMPARATIVE PRODUCT |
| TEST SAMPLE 5 | 2400 | 0.423 | 243 | × | COMPARATIVE PRODUCT |
| TEST SAMPLE 6 | 2310 | 0.356 | 469 | × | COMPARATIVE PRODUCT |
| TEST SAMPLE 7 | 3010 | 0.198 | 670 | ○ | INVENTED PRODUCT |
| TEST SAMPLE 8 | 3220 | 0.169 | 790 | ○ | INVENTED PRODUCT |
| TEST SAMPLE 9 | 3170 | 0.175 | 805 | ○ | INVENTED PRODUCT |
| TEST SAMPLE 10 | 3320 | 0.189 | 990 | ○ | INVENTED PRODUCT |
| TEST SAMPLE 11 | 3400 | 0.193 | 897 | ○ | INVENTED PRODUCT |
| TEST SAMPLE 12 | 3350 | 0.177 | 989 | ○ | INVENTED PRODUCT |
| TEST SAMPLE 13 | 3540 | 0.192 | 861 | ○ | INVENTED PRODUCT |
| TEST SAMPLE 14 | 3100 | 0.199 | 993 | ○ | INVENTED PRODUCT |
| TEST SAMPLE 15 | 3250 | 0.199 | 849 | ○ | INVENTED PRODUCT |
| TEST SAMPLE 16 | 3300 | 0.179 | 894 | ○ | INVENTED PRODUCT |
| TEST SAMPLE 17 | 3420 | 0.177 | 941 | ○ | INVENTED PRODUCT |
| TEST SAMPLE 18 | 3290 | 0.199 | 910 | ○ | INVENTED PRODUCT |
| TEST SAMPLE 19 | 3350 | 0.191 | 850 | ○ | INVENTED PRODUCT |
| TEST SAMPLE 20 | 3410 | 0.183 | 841 | ○ | INVENTED PRODUCT |
| TEST SAMPLE 21 | 3390 | 0.193 | 833 | ○ | INVENTED PRODUCT |
| TEST SAMPLE 22 | 3280 | 0.199 | 874 | ○ | INVENTED PRODUCT |
| TEST SAMPLE 23 | 3290 | 0.192 | 890 | ○ | INVENTED PRODUCT |
| TEST SAMPLE 24 | 3470 | 0.188 | 901 | ○ | INVENTED PRODUCT |
| TEST SAMPLE 25 | 3420 | 0.179 | 799 | ○ | INVENTED PRODUCT |
| TEST SAMPLE 26 | 3290 | 0.199 | 833 | ○ | INVENTED PRODUCT |
| TEST SAMPLE 27 | 3470 | 0.183 | 890 | ○ | INVENTED PRODUCT |
| TEST SAMPLE 28 | 3500 | 0.169 | 910 | ○ | INVENTED PRODUCT |
| TEST SAMPLE 29 | 3100 | 0.200 | 957 | ○ | INVENTED PRODUCT |
| TEST SAMPLE 30 | 3240 | 0.188 | 983 | ○ | INVENTED PRODUCT |
| TEST SAMPLE 31 | 3360 | 0.174 | 850 | ○ | INVENTED PRODUCT |
| TEST SAMPLE 32 | 3380 | 0.182 | 906 | ○ | INVENTED PRODUCT |
| TEST SAMPLE 33 | 3410 | 0.156 | 793 | ○ | INVENTED PRODUCT |
| TEST SAMPLE 34 | 3320 | 0.167 | 810 | ○ | INVENTED PRODUCT |
| TEST SAMPLE 35 | 3470 | 0.179 | 850 | ○ | INVENTED PRODUCT |
| TEST SAMPLE 36 | 3390 | 0.188 | 910 | ○ | INVENTED PRODUCT |
| TEST SAMPLE 37 | 3250 | 0.169 | 900 | ○ | INVENTED PRODUCT |
| TEST SAMPLE 38 | 3380 | 0.184 | 899 | ○ | INVENTED PRODUCT |
| TEST SAMPLE 39 | 3360 | 0.159 | 801 | ○ | INVENTED PRODUCT |
| TEST SAMPLE 40 | 3450 | 0.156 | 877 | ○ | INVENTED PRODUCT |
| TEST SAMPLE 41 | 3410 | 0.192 | 791 | ○ | INVENTED PRODUCT |
| TEST SAMPLE 42 | 3390 | 0.182 | 789 | ○ | INVENTED PRODUCT |
| TEST SAMPLE 43 | 3410 | 0.157 | 796 | ○ | INVENTED PRODUCT |
| TEST SAMPLE 44 | 3400 | 0.197 | 910 | ○ | INVENTED PRODUCT |
| TEST SAMPLE 45 | 3350 | 0.188 | 950 | ○ | INVENTED PRODUCT |
| TEST SAMPLE 46 | 3340 | 0.196 | 977 | ○ | INVENTED PRODUCT |
| TEST SAMPLE 47 | 3500 | 0.199 | 984 | ○ | INVENTED PRODUCT |
| TEST SAMPLE 48 | 3400 | 0.165 | 810 | ○ | INVENTED PRODUCT |
| TEST SAMPLE 49 | 3320 | 0.171 | 891 | ○ | INVENTED PRODUCT |
| TEST SAMPLE 50 | 3420 | 0.181 | 877 | ○ | INVENTED PRODUCT |

HARD COATING AND HARD-COATING-COVERED MEMBER

TECHNICAL FIELD

The present invention relates to a hard coating and a hard-coating-covered member, and more particularly to such a hard coating having excellent wear resistance and excellent welding resistance.

BACKGROUND ART

A hard coating is provided to cover a surface of a substrate made of cemented carbide, high-speed tool steel or the like, in various members such as various machining tools and friction parts that are required to have wear resistance, wherein the various machining tools include cutting tools such as an endmill, a milling cutter, a drill, a lathe cutter and a cutting tip, and non-cutting tools such as a forming tap and a rolling tool. For example, in Patent Document 1, there is proposed a hard coating of a multilayer structure of AlCrN system/AlTiSiN system. In Patent Document 2, there is proposed a hard coating of a multilayer structure of AlCrN system/CrN system. In Patent Document 3, there is proposed a hard coating of a multilayer structure of AlCr system/TiSi system.

PRIOR ART DOCUMENTS

Patent Documents

[Patent Document 1]
Japanese Unexamined Patent Application Publication No. 2012-35378
[Patent Document 2]
Japanese Unexamined Patent Application Publication No. 2014-79834
[Patent Document 3]
Japanese Unexamined Patent Application Republication No. 2008-534297

DISCLOSURE OF THE INVENTION

Object to be Achieved by the Invention

However, there is a possibility that the conventional hard coating also can not necessarily provide sufficiently satisfactory wear resistance and welding resistance, for example, depending on machining conditions and use conditions such as kinds of workpiece materials and cutting speeds, so that there is still a room for the improvement. For example, there is a case in which the wear resistance cannot be obtained sufficiently when the cutting tool covered by the hard coating of the multilayer structure of AlCrN system/CrN system is used for cutting operations for cutting carbon steel, cast iron or the like.

The present invention was made in view of the background discussed above. It is therefore an object of the present invention to provide a hard coating and a hard-coating-covered tool having a novel construction that is excellent in wear resistance and welding resistance.

Measures for Achieving the Object

Various experiments and studies made by the inventors of the present invention and their collaborators under the above-described situation revealed a fact that excellent wear resistance and excellent welding resistance can be obtained by using an A composition, a B composition and a C composition and laminating them, for example, with certain thicknesses, wherein the A composition is a nitride of AlCrα wherein an optional additive component α is at least one kind of element selected from B, C, Ti, V, Y, Zr, Nb, Mo, Hf, Ta and W, the B composition is a nitride of AlCrSiβ wherein an optional additive component β is at least one kind of element selected from B, C, Ti, V, Y, Zr, Nb, Mo, Hf, Ta and W, and the C composition is a nitride of Al Cr (SiC) γ wherein an optional additive component γ is at least one kind of element selected from B, C, Ti, V, Y, Zr, Nb, Mo, Hf, Ta and W. The present invention was made based on the revealed fact.

A first invention is, in a hard coating that is to be adhered to a surface of a substrate so as to cover the surface of the substrate, characterized in that: (a) the hard coating has a total thickness of a range of 0.5-20 μm and includes three kinds of layers that are alternately laminated, wherein the three kinds of layers consist of two kinds of single composition layers and a nanolayer-alternated layer, wherein the two kinds of single composition layers are constituted by respective two of an A composition, a B composition and a C composition, and wherein the nanolayer-alternated layer includes two kinds of nanolayers which are constituted by respective two of the A composition, the B composition and the C composition and which are alternately laminated; (b) the A composition is a nitride that is represented by a composition formula of $Al_a Cr_b \alpha_c$, wherein atomic ratios a, b, c satisfy $0.30 \leq a \leq 0.85$, $0.15 \leq b \leq 0.70$, $0 \leq c \leq 0.10$ and $a+b+c=1$, and wherein an optional additive component α is at least one kind of element selected from B, C, Ti, V, Y, Zr, Nb, Mo, Hf, Ta and W; (c) the B composition is a nitride that is represented by a composition formula of $Al_d Cr_e Si_f \beta_g$, wherein atomic ratios d, e, f, g satisfy $0.20 \leq d \leq 0.85$, $0.10 \leq e \leq 0.50$, $0.03 \leq f \leq 0.45$, $0 \leq g \leq 0.10$ and $d+e+f+g=1$, and wherein an optional additive component β is at least one kind of element selected from B, C, Ti, V, Y, Zr, Nb, Mo, Hf, Ta and W; (d) the C composition is a nitride that is represented by a composition formula of $Al_h Cr_i (SiC)_j \gamma_k$, wherein atomic ratios h, i, j, k satisfy $0.20 \leq h \leq 0.85$, $0.10 \leq i \leq 0.50$, $0.03 \leq j \leq 0.45$, $0 \leq k \leq 0.10$ and $h+i+j+k=1$, and wherein an optional additive component γ is at least one kind of element selected from B, C, Ti, V, Y, Zr, Nb, Mo, Hf, Ta and W; (e) each of the two kinds of single composition layers has a thickness of a range of 0.5-1000 nm; and (f) each of the two kinds of nanolayers has a thickness of a range of 0.5-500 nm, and the nanolayer-alternated layer has a thickness of a range of 1-1000 nm.

It is noted that the (SiC) of the C composition means that the (SiC) is present in the form of silicon carbide as a compound. Further, it is difficult to accurately control the thickness of each layer throughout the whole area. Each of the thicknesses described in the present description is an average thickness value, and the thickness may be partially deviated from a corresponding one of the above-described value ranges as long as the average thickness value falls within the corresponding one of the above-described value ranges.

A second invention is, in the hard coating of the first invention, characterized in that a ratio T1/T3 of the thickness T1 of one of the two kinds of the single composition layers to the thickness T3 of the nanolayer-alternated layer and a ratio T2/T3 of the thickness T2 of the other of the two kinds of the single composition layers to the thickness T3 of the nanolayer-alternated layer are both in range of 0.2-10.

A third invention is, in the hard coating of the first or second invention, characterized in that a lowermost layer of the two kinds of the single composition layers and the nanolayer-alternated layer, which are alternately laminated, is to be disposed directly on a surface of the substrate.

A fourth invention is, in the hard coating of the first or second invention, characterized in that: (a) the hard coating includes an interface layer that is to be disposed between the hard coating and the substrate; (b), (c) the interface layer has a thickness of a range of 10-1000 nm, and is provided by one of three kinds of layers that are: (b-1) a single composition layer constituted by one of the A composition, the B composition and the C composition; (b-2) a nanolayer-alternated layer includes two kinds of nanolayers which are constituted by respective two of the A composition, the B composition and the C composition and which are alternately laminated, such that each of the two kinds of nanolayers has a thickness of a range of 0.5-500 nm; and (b-3) a layer of metal nitride, metal carbonitride or metal carbide, which is constituted by at least one kind of element selected from B, Al, Ti, Y, Zr, Hf, V, Nb, Ta, Cr and W.

A fifth invention is, in the hard coating of any one of the first through fourth inventions, is characterized in that: (a) the hard coating includes a surface layer providing an outermost surface of the hard coating; (b) the surface layer is provided by a single composition layer constituted by one of the A composition, the B composition and the C composition, or a nanolayer-alternated layer including two kinds of nanolayers which are constituted by respective two of the A composition, the B composition and the C composition and which are alternately laminated such that each of the two kinds of nanolayers has a thickness of a range of 0.5-500 nm; and (c) the surface layer has a thickness of a range of 5-1000 nm.

A sixth invention is a hard-coating-covered member including a substrate whose surface is partially or entirely covered with a hard coating, and the hard-coating-covered member being characterized in that the hard coating is the hard coating of any one of the first through fifth inventions.

A seventh invention is, in the hard-coating-covered member of the sixth invention, is characterized in that the hard-coating-covered member is an intermittent cutting tool which includes cutting edges and which is to be rotated about an axis so as to perform an intermittent cutting operation by the cutting edges.

It is noted that, as long as a rounded value of an actual value is within a corresponding one of numerical ranges defined in the above-described inventions, such an actual value is interpreted to be within the corresponding one of the numerical ranges.

Effects of the Invention

In the hard coating of the present invention described above, the single composition layer constituted by the A composition has high hardness and is excellent in wear resistance, and the single composition layer constituted by the B composition has high hardness and is excellent in wear resistance and oxidation resistance. Further, the single composition layer constituted by the C composition has low bondability with oxygen because Si is present in the form of SiC (silicon carbide) as a compound in the C composition, and the degree of hardness is high with reduction of mechanical strength being low even at a temperature of 1000° C. or higher because the SiC is a covalent bond, so that the single composition layer constituted by the C composition is excellent in heat resistance, wear resistance and oxidation resistance. Further, the components $\alpha$, $\beta$, $\gamma$ are added optionally added to the respective A composition, B composition and C composition, at a ratio of 10 at % (atomic %) or less, whereby it is possible to micronize crystal particles of the coating and to control sizes of the particles of the coating by controlling the addition amount, thereby enabling the hardness, toughness and lubricity of the coating to be adjusted. Owing to the construction in which the two kinds of single composition layers and the nanolayer-alternated layer having the above-described characteristics are alternately laminated with predetermined thicknesses, it has become possible to obtain the hard coating that is excellent in the wear resistance, toughness, lubricity and welding resistance. Owing to these features, in a case of a cutting tool, for example, it has become possible to increase a service life of the tool in a cutting operation with various workpiece materials such as carbon steel, cast iron, alloy steel and stainless steel, or in a severe machining condition such as high speed machining and dry machining.

In the second invention, since the ratio T1/T2 of the thickness T1 of one of the two kinds of the single composition layers to the thickness T3 of the nanolayer-alternated layer and the ratio T2/T3 of the thickness T2 of the other of the two kinds of the single composition layers to the thickness T3 of the nanolayer-alternated layer are both in range of 0.2-10, the two kinds of single composition layers and the nanolayer-alternated layer are provided with appropriate thicknesses providing certain characteristics, which make it possible to appropriately obtain performances such as the wear resistance and welding resistance.

In the third invention, the lowermost layer of the three kinds of layers consisting of the two kinds of the single composition layers and the nanolayer-alternated layer, which are alternately laminated, is to be disposed directly on a surface of the substrate, so that a coating formation cost can be made lower than in an arrangement in which the interface layer or the like is provided in a boundary adjacent to the substrate.

In the fourth invention, the interface constituted by the predetermined composition or compositions and having the predetermined thickness is provided in the boundary adjacent to the substrate, so that it is possible to increase an adhesion strength of the heard coating to the substrate.

In the fifth invention, the surface layer constituted by the predetermined composition or compositions and having the predetermined thickness is provided as an outermost layer of the hard coating, so that it is possible to further improve certain coating performances such as the wear resistance and welding resistance, by appropriately determining the composition or compositions and the thickness of the surface layer of the surface layer.

In the sixth invention relating to a hard-coating-covered member, with the hard coating of each of the first through fifth inventions being provided, it is possible to obtain substantially the same effects as a corresponding one of the inventions.

In the seventh invention, the hard-coating-covered member is the intermittent cutting tool such as endmill and milling cutter, so that impact load is repeatedly applied to the hard-coating-covered member and the hard-coating-covered member is easily heated when a cutting operation is intermittently performed by the cutting edges. Therefore, the hard coating of the present invention, which is capable of obtaining high wear resistance, high toughness and high welding resistance, is advantageously used for such an intermittent cutting tool.

BRIEF DESCRIPTION OF DRAWINGS

FIG. 10 is a view showing kinds of constituent elements and their content ratios in an A composition constituting the hard coating of each of test samples 1-50 that were used in a cutting test.

FIG. 11 is a view showing kinds of constituent elements and their content ratios in a B composition constituting the hard coating of each of the test samples 1-50.

FIG. 12 is a view showing kinds of constituent elements and their content ratios in a C composition constituting the hard coating of each of the test samples 1-50.

FIG. 13 is a view showing the coating structure of the hard coating of each of the test samples 1-50.

FIG. 14 is a view showing a coating hardness of the hard coating of each of the test samples 1-50, and also a wear width, a cutting distance and an evaluation result that were measured or obtained in the cutting test.

MODES FOR CARRYING OUT THE INVENTION

Figure 1:
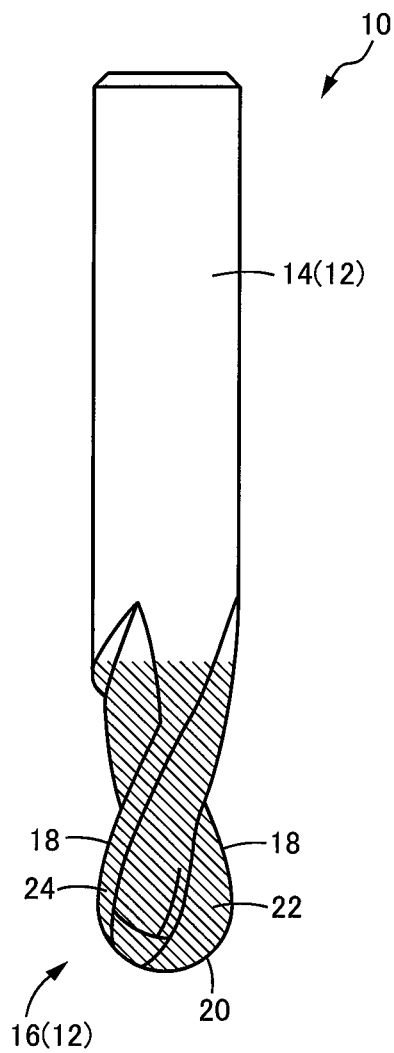
FIG. 1 is a front view showing, by way of example, a ball endmill to which the present invention is applied.

The present invention is advantageously is applied to a hard coating which is to be disposed on a surface of any one of various machining tools that include rotary cutting tools such as an endmill, a milling cutter, a tap and a drill, non-rotary cutting tools such as a lathe cutter, non-cutting tools such as a forming tap, a rolling tool and a press die. However, the present invention is applicable also to a hard coating serving as a surface protective coating of a bearing member, a semiconductor device or the like, namely, a hard coating which is to be disposed on any one of members other than the machining tools, and which are required to have wear resistance and oxidation resistance. Further, the present invention is applicable also to a cutting tip that is to be attached to any one of various machining tools so as to be used. As a tool substrate of a hard-coating-covered tool, cemented carbide, high-speed tool steel, cermet, ceramics, polycrystalline diamond (PCD), monocrystalline diamond, polycrystalline CBN or monocrystalline CBN is advantageously used, although the other tool material also can be used. As a method of forming the hard coating, a PVD method (physical vapor deposition method) such as an arc ion plating, sputtering and PLD (pulse laser deposition) is advantageously used.

The hard coating includes three kinds of layers that are alternately laminated, wherein the three kinds of layers consist of two kinds of single composition layers and a nanolayer-alternated layer, wherein the two kinds of single composition layers are constituted by respective two of an A composition, a B composition and a C composition, and wherein the nanolayer-alternated layer includes two kinds of nanolayers which are constituted by respective two of the A composition, the B composition and the C composition and which are alternately laminated. Therefore, for example, where the two kinds of single composition layers are constituted by the A composition and the B composition, respectively, and the two kinds of nanolayers included in the nanolayer-alternated layer are constituted by the A composition and the B composition, respectively, the C composition is not needed. Thus, the hard coating can be constituted by only two out of the A composition, the B composition and the C composition. Further, the two kinds of single composition layers and the nanolayer-alternated layer may be laminated in an order that is appropriately determined. It is preferable that the three kinds of layers consisting of the two kinds of single composition layers and the nanolayer-alternated layer are laminated in the predetermined order for at least one cycle, and that the three kinds of layers are laminated for a completed cycle or cycles so that numbers of the respective three kinds of layers are equal to one another. However, the lamination of the three kinds of layers may be terminated without an uppermost layer of the three kinds of layers completing a corresponding cycle, for example, such that the uppermost layer is the same in kind as a lowermost layer of the three kinds of layers. The same description is applied also to the nanolayer-alternated layer including the two kinds of nanolayers that are alternately laminated. Where the hard coating includes an interface layer and/or a surface layer, the total thickness of the hard coating includes a thickness of the interface layer and/or a thickness of the surface layer.

It is preferable that a ratio T1/T3 of the thickness T1 of one of the two kinds of the single composition layers to the thickness T3 of the nanolayer-alternated layer and a ratio T2/T3 of the thickness T2 of the other of the two kinds of the single composition layers to the thickness T3 of the nanolayer-alternated layer are both in a range of 0.2-10. However, each of the thicknesses T1, T2, T3 may be set to a value by which the corresponding ratio is deviated from the corresponding numerical range. The hard coating may include an interface layer, as needed, which is to be provided to be adjacent to the substrate. It is preferable that the interface layer is constituted by a single composition layer constituted by one of the A composition, the B composition and the C composition, or a nanolayer-alternated layer includes two kinds of nanolayers which are constituted by respective two of the A composition, the B composition and the C composition and which are alternately laminated. However, the interface layer may be a layer of metal nitride, metal carbonitride or metal carbide, which is constituted by at least one kind of element selected from B, Al, Ti, Y, Zr, Hf, V, Nb, Ta, Cr and W, or a layer constituted by another composition or compositions. The interface layer has a thickness that is preferably in a range of 10-1000 nm. However, the thickness of the interface layer may be outside the numerical range of 10-1000 nm.

The hard coating may include a surface layer, as needed. It is preferable that the surface layer is constituted by a single composition layer constituted by one of the A composition, the B composition and the C composition, or a nanolayer-alternated layer including two kinds of nanolayers which are constituted by respective two of the A composition, the B composition and the C composition and which are alternately laminated. However, the surface layer may be a layer constituted by another composition or compositions. The surface layer has a thickness that is preferably in a range of 5-1000 nm. However, the thickness of the surface layer may be outside the numerical range of 5-1000 nm.

According to the findings made by the inventors of the present invention and their collaborators, owing to the alternate lamination of the three kinds of layers consisting of the two kinds of single composition layers and the nanolayer-alternated layer, the hard coating of the present invention provides higher oxidation resistance, hardness, wear resistance and shear strength, than a multilayer coating of AlCrN base. Further, high hardness can be realized owing to impedance of lattice dislocation, which is made by an interface between each adjacent two of the layers having various elastic properties (modulus of elasticity and degree of hardness). The interface contributes to not only increase of the coating hardness but also improvement of toughness, owing to the function of impeding energy dissipation and crack extension. On the other hand, since the interface largely influences on characteristics of the multilayer coating, the provision of the nanolayer-alternated layer in which a cycle of lamination of the nanolayers is in a range of nanometers makes it possible to obtain effects of improvements of mechanical properties and tribology of the hard coating, by appropriately adjusting sizes of the crystal particles and coating density by controlling the thickness of each of the nanolayers of the nanolayer-alternated layer.

Embodiment

Hereinafter, an embodiment of the present invention will be described in details with reference to the drawings.

Figure 2:
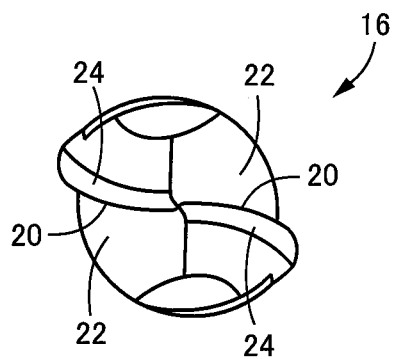
FIG. 2 is an enlarged bottom view as seen from a side of a distal end of the ball endmill of FIG. 1.

FIG. 1 is a front view showing a ball endmill 10 that is an example of a hard-coating-covered member to which the present invention is applied. FIG. 2 is an enlarged bottom view as seen from a side of a distal end of the ball endmill 10. The ball endmill 10 includes a tool substrate 12 (see FIGS. 3-8) constituted by cemented carbide, and the tool substrate 12 includes a shank portion 14 and a blade portion 16 that are integral with each other. The blade portion 16 is provided with a pair of cutting edges that are symmetrical with respect to an axis of the ball endmill 10, wherein each of the cutting edges includes a peripheral cutting edge 18 and a ball-end cutting edge 20. With the ball endmill 10 being rotated about the axis, the ball endmill 10 performs an intermittent cutting operation by the peripheral cutting edge 18 and the ball-end cutting edge 20 of each cutting edge. The peripheral cutting edge 18 and the ball-end cutting edge 20 are smoothly connected to each other so as to be contiguous to each other. On respective opposite sides of each cutting edge including the peripheral cutting edge 18 and the ball-end cutting edge 20, a rake face 22 and a flank face (relief face) 24 are defined. In other words, the peripheral cutting edge 18 and the ball-end cutting edge 20 are provided on a ridge line that is an intersection of the rake face 22 and the flank face 24. The ball endmill 10 is a hard-coating-covered tool, and corresponds to an intermittent cutting tool.

Figure 3:
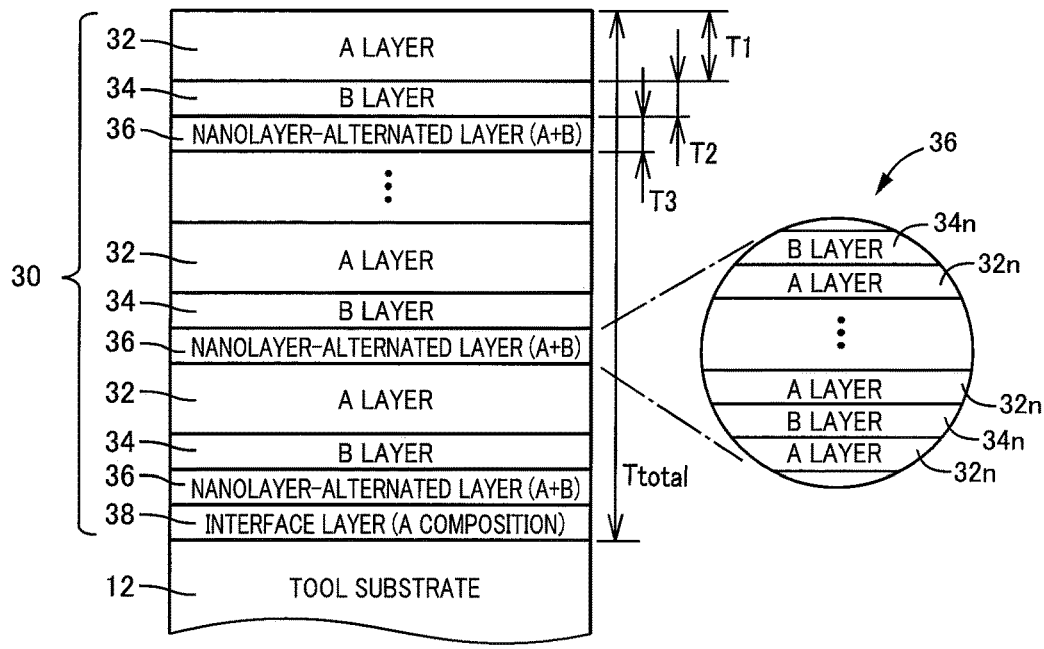
FIG. 3 is a schematic view for explaining a coating structure of a hard coating that is provided on the ball endmill of FIG. 1.

A hard coating 30 shown in FIG. 3 is provided to cover a surface of the blade portion 16 that is a portion of the tool substrate 12. FIG. 3 is a schematic view showing in enlargement a cross section of a neighborhood of the surface of blade portion 16 covered by the hard coating 30. A region of the surface covered by the hard coating 30 is represented by a hatched area in FIG. 1. It is also possible to provide the hard coating 30 such that an entirety of the ball endmill 10 including also the shank portion 14 is covered with the hard coating 30.

The hard coating 30 has a multilayer structure, and includes an A layer 32, a B layer 34 and a nanolayer-alternated layer 36 that are arranged in this order of description as seen in a direction away from an outer surface of the hard coating 30 toward the tool substrate 12. The A layer 32, the B layer 34 and the nanolayer-alternated layer 36 are laminated for at least one cycle. The hard coating 30 further includes an interface layer 38 that is provided in its boundary portion adjacent to the tool substrate 12. That is, the interface layer 38 is first disposed on a surface of the tool substrate 12, and then the nanolayer-alternated layer 36, B layer 34 and A layer 32 are disposed on the interface layer 38. The nanolayer-alternated layer 36, B layer 34 and A layer 32 are laminated repeatedly in this order of description, such that an uppermost portion of the hard coating 30 is provided by the A layer 32. The hard coating 30 including the interface layer 38 has a total thickness Ttotal that is appropriately set to a value within a range of 0.5-20 μm. The A layer 32 has a thickness T1 that is appropriately set to a value within a range of 0.5-1000 nm. The B layer 34 has a thickness T2 that is appropriately set to a value within a range of 0.5-1000 nm. The nanolayer-alternated layer 36 has a thickness T3 that is appropriately set to a value within a range of 1-1000 nm. Further, the thicknesses T1-T3 are set to the respective values such that a ratio T1/T3 of the thickness T1 to the thickness T3 and a ratio T2/T3 of the thickness T2 to the thickness T3 are both in a range of 0.2-10.

The A layer 32 is a single composition layer that is constituted by only an A composition. The A composition is a nitride represented by a composition formula of $Al_aCr_b\alpha_c$, wherein atomic ratios a, b, c satisfy $0.30 \leq a \leq 0.85$, $0.15 \leq b \leq 0.70$, $0 \leq c \leq 0.10$ and $a+b+c=1$, and wherein an optional additive component $\alpha$ is at least one kind of element selected from B, C, Ti, V, Y, Zr, Nb, Mo, Hf, Ta and W. FIG. 10 is a view showing examples of a content (at %) of each element of the A composition, wherein each blank represents that the content (at %) of the corresponding element is 0, and each gray part (column provided with scatter points) represents that the atomic ratio corresponding to the content of the corresponding element is deviated from the corresponding numerical range of the above-described composition formula. That is, the test samples 7-50 satisfy requirements of the A composition. The A layer 32 having such a composition has features of high hardness and excellent wear resistance. Further, with addition of the optional additive component $\alpha$ with the ratio not larger than 10 at %, it is possible to micronize crystal particles and to control sizes of the particles by controlling the addition amount, whereby the hardness, toughness and lubricity of the coating can be adjusted.

The B layer 34 is a single composition layer that is constituted by only a B composition. The B composition is a nitride represented by a composition formula of $Al_d Cr_e Si_f \beta_g$, wherein atomic ratios d, e, f, g satisfy $0.20 \leq d \leq 0.85$, $0.10 \leq e \leq 0.50$, $0.03 \leq f \leq 0.45$, $0 \leq g \leq 0.10$ and $d+e+f+g=1$, and wherein an optional additive component $\beta$ is at least one kind of element selected from B, C, Ti, V, Y, Zr, Nb, Mo, Hf, Ta and W. FIG. 11 is a view showing examples of a content (at %) of each element of the B composition, wherein each blank represents that the content (at %) of the corresponding element is 0, and each gray part (column provided with scatter points) represents that the atomic ratio corresponding to the content of the corresponding element is deviated from the corresponding numerical range of the above-described composition formula. That is, the test samples 7-50 satisfy requirements of the B composition. The B layer 34 having such a composition has features of high hardness and excellent wear resistance and excellent oxidation resistance. As the above-described optional additive component α, the optional additive component β is at least one kind of element selected from B, C, Ti, V, Y, Zr, Nb, Mo, Hf, Ta and W. With addition of the optional additive component β with the ratio not larger than 10 at %, it is possible to micronize crystal particles and to control sizes of the particles by controlling the addition amount, whereby the hardness, toughness and lubricity of the coating can be adjusted.

The nanolayer-alternated layer 36 has multilayer structure including an A nanolayer 32n and a B nanolayer 34n that are alternately laminated for at least one cycle, wherein the A nanolayer 32n is constituted by the A composition as the A layer 32, and the B nanolayer 34n is constituted by the B composition as the B layer 34. In this embodiment, a lowermost portion of the nanolayer-alternated layer 36, which is adjacent to the A layer 32, is provided by the A nanolayer 32n, while an uppermost portion of the nanolayer-alternated layer 36, which is adjacent to the B layer 34, is provided by the B nanolayer 34n. However, the lowermost portion and the uppermost portion of the nanolayer-alternated layer 36 may be provided by the B nanolayer 34n and the A nanolayer 32n, respectively. The A nanolayer 32n and the B nanolayer 34n have respective thicknesses each of which is appropriately set to a value within a range of 0.5-500 nm. The nanolayer-alternated layer 36 has features of high hardness, excellent wear resistance, excellent toughness and excellent oxidation resistance. That is, the interface between the nanolayers 32n, 34n contributes to increase of the coating hardness and also improvement of toughness owing to the function of impeding energy dissipation and crack extension. Further, since a cycle of lamination of the nanolayers 32n, 34n is in a range of nanometers, it is possible to obtain effects of improvements of mechanical properties and tribology of the hard coating, by appropriately adjusting sizes of the crystal particles and coating density by controlling the thickness of each of the nanolayers 32n, 34n.

The interface layer 38 is a single composition layer constituted by only the A composition as the A layer 32. The interface layer 38 has a thickness that is appropriately set to a value within a range of 10-1000 nm. With the interface layer 38 being provided in a boundary adjacent to the tool substrate 12, an adhesion strength of the hard coating 30 to the tool substrate 12 can be increased.

Figure 4:
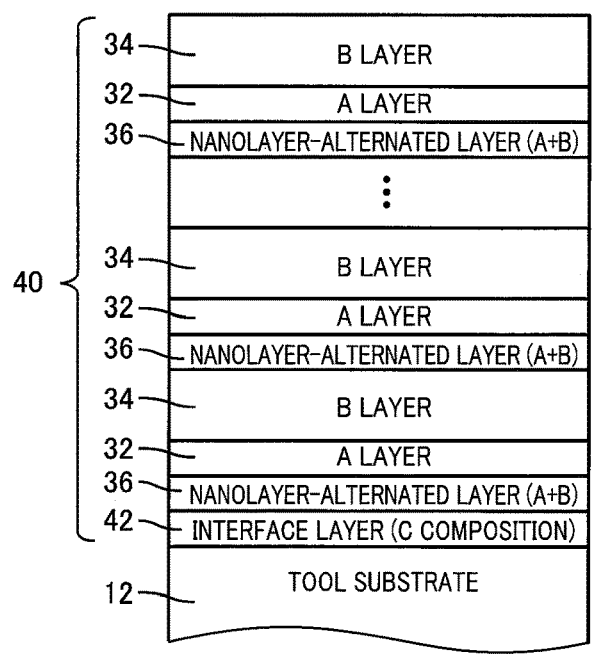
FIG. 4 is a schematic view for explaining another example of the coating structure of the hard coating that is provided on the ball endmill of FIG. 1.

FIGS. 4-8 are views for explaining other examples of the hard coatings each of which is to be disposed on the surface of the blade portion 16 of the ball endmill 10. Each of FIGS. 4-8 is a cross-sectional schematic view corresponding to the view of FIG. 3, and the total thickness Ttotal of any one of the hard coatings is in a range of 0.5-20 μm. A hard coating 40 of FIG. 4 is opposite to the above-described hard coating 30 in terms of order of laminations of the A layer 32 and the B layer 34. In the hard coating 40 of FIG. 4, the A layer 32 is disposed between the B layer 34 and the nanolayer-alternated layer 36, and the B layer 34 provides the uppermost or outermost layer. Further, an interface layer 42 of a C composition is provided in place of the interface layer 38 of the A composition. The C composition is a nitride that is represented by a composition formula of $Al_hCr_i(SiC)_{j\gamma k}$, wherein atomic ratios h, i, j, k satisfy $0.20 \le h \le 0.85$, $0.10 \le i \le 0.50$, $0.03 \le j \le 0.45$, $0 \le k \le 0.10$ and $h+i+j+k=1$, and wherein an optional additive component γ is at least one kind of element selected from B, C, Ti, V, Y, Zr, Nb, Mo, Hf, Ta and W. FIG. 12 is a view showing examples of a content (at %) of each element of the C composition, wherein each blank represents that the content (at %) of the corresponding element is 0, and each gray part (column provided with scatter points) represents that the atomic ratio corresponding to the content of the corresponding element is deviated from the corresponding numerical range of the above-described composition formula. That is, the test samples 7-50 satisfy requirements of the C composition. The interface layer 42 is a single composition layer constituted by only the C composition, and has a thickness that is appropriately set to a value within a range of 10-1000 nm. With the interface layer 42 being provided in a boundary adjacent to the tool substrate 12, an adhesion strength of the hard coating 40 to the tool substrate 12 can be increased.

Figure 5:
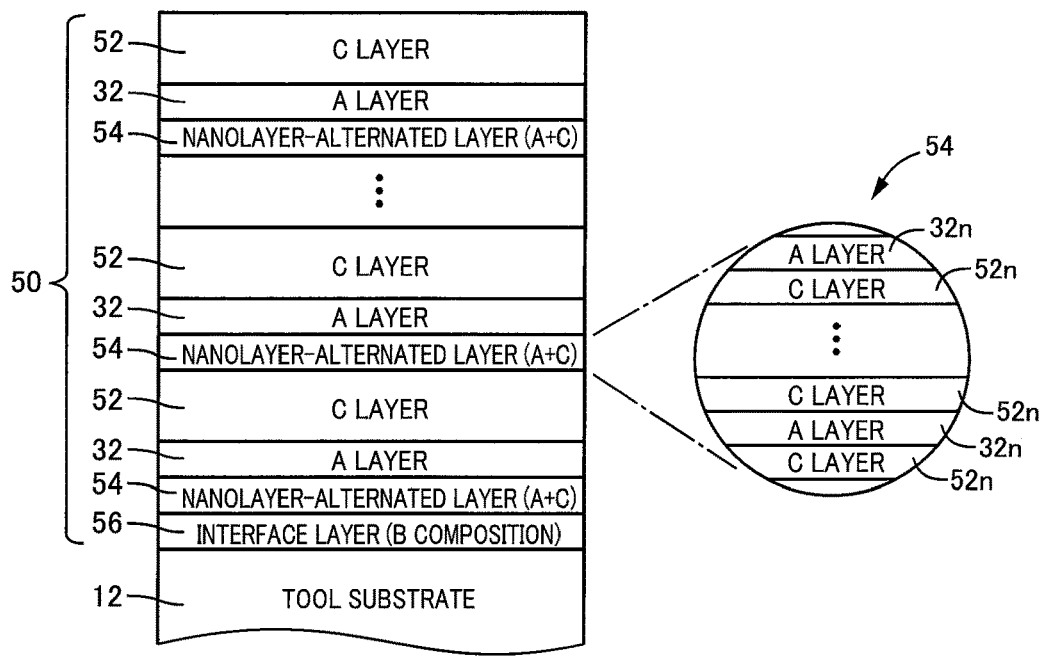
FIG. 5 is a schematic view for explaining still another example of the coating structure of the hard coating that is provided on the ball endmill of FIG. 1.

In a hard coating 50 of FIG. 5, a C layer 52 constituted by only the C composition is provided in place of the above-described B layer 34, and a nanolayer-alternated layer 54 is provided in place of the above-described nanolayer-alternated layer 36. The nanolayer-alternated layer 54 includes an A nanolayer 32n constituted by the A composition and a C nanolayer 52n constituted by the C composition, such that the A nanolayer 32n and the C nanolayer 52n are alternately laminated for at least one cycle. Each of the C layer 52 and C nanolayer 52n has low bondability with oxygen because Si is present in the form of SiC (silicon carbide) as a compound in the C composition, and the degree of hardness is high with reduction of mechanical strength being low even at a temperature of 1000° C. or higher because the SiC is a covalent bond, so that the C layer 52 and C nanolayer 52n have features of excellent heat resistance, excellent wear resistance and excellent oxidation resistance. As the above-described optional additive component α, the optional additive component γ is at least one kind of element selected from B, C, Ti, V, Y, Zr, Nb, Mo, Hf, Ta and W. With addition of the optional additive component γ with the ratio not larger than 10 at %, it is possible to micronize crystal particles and to control sizes of the particles by controlling the addition amount, whereby the hardness, toughness and lubricity of the coating can be adjusted. The C layer 52 is a single composition layer constituted by only the C composition. The C layer 52 has a thickness which is appropriately set to a value within a range of 0.5-1000 nm such that a ratio of the thickness of the C layer 52 to the thickness of the nanolayer-alternated layer 54 is in a range of 0.2-10. In this embodiment, a lowermost portion of the nanolayer-alternated layer 54, which is adjacent to the C layer 52, is provided by the C nanolayer 52n, while an uppermost portion of the nanolayer-alternated layer 54, which is adjacent to the A layer 32, is provided by the A nanolayer 32n. However, the lowermost portion and the uppermost portion of the nanolayer-alternated layer 54 may be provided by the A nanolayer 32n and the C nanolayer 52n, respectively. The nanolayer-alternated layer 54 has a thickness that is appropriately set to a value within a range of 1-1000 nm. The A nanolayer 32n and the C nanolayer 52n have respective thicknesses each of which is appropriately set to a value within a range of 0.5-500 nm. As above-described the nanolayer-alternated layer 36, the nanolayer-alternated layer 54 has features of high hardness, excellent wear resistance, excellent toughness and excellent oxidation resistance. Further, the hard coating 50 includes an interface layer 56 that is a single composition layer constituted by only the above-described B composition.

Figure 6:
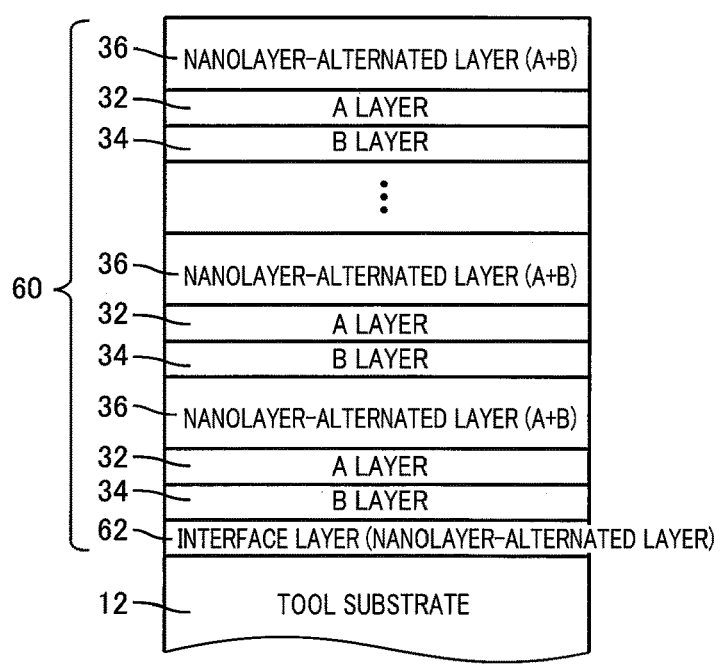
FIG. 6 is a schematic view for explaining still another example of the coating structure of the hard coating that is provided on the ball endmill of FIG. 1.

A hard coating 60 of FIG. 6 is different from the above-described hard coating 30 of FIG. 3 in terms of order of laminations of the A layer 32, B layer 34 and nanolayer-alternated layer 36. In the hard coating 60 of FIG. 6, the nanolayer-alternated layer 36, A layer 32 and B layer 34 are laminated in this order of description as seen in a direction away from the outer surface of the hard coating 30 toward the tool substrate 12. Further, the hard coating 60 includes an interface layer 62 that is provided between the lowermost B layer 34 and the tool substrate 12, wherein the interface layer 62 is a nanolayer-alternated layer includes two kinds of the A nanolayer 32$n$, B nanolayer 34$n$ and C nanolayer 52$n$, and wherein the two kinds of nanolayers are alternately laminated. The interface layer 62 has a thickness that is appropriately set to a value within a range of 10-1000 nm, and each of the two kinds of nanolayers has a thickness that is appropriately set to a value within a range of 0.5-500 nm.

Figure 7:
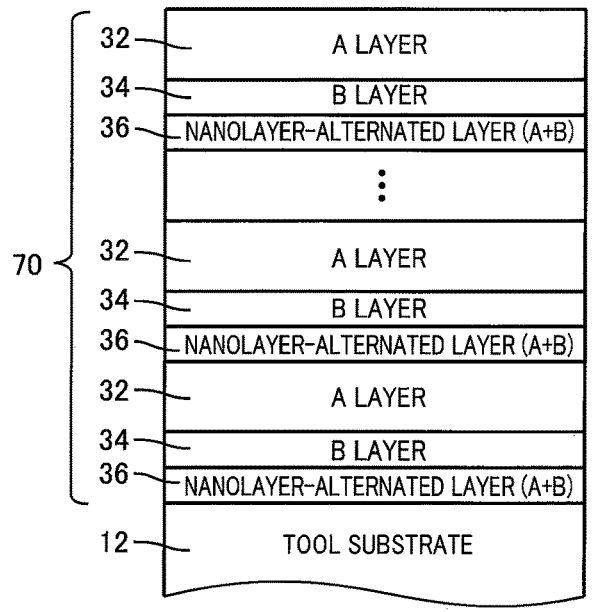
FIG. 7 is a schematic view for explaining still another example of the coating structure of the hard coating that is provided on the ball endmill of FIG. 1.

A hard coating 70 of FIG. 7 is different from the above-described hard coating 30 of FIG. 3 in that the interface layer 38 is absent.

Figure 8:
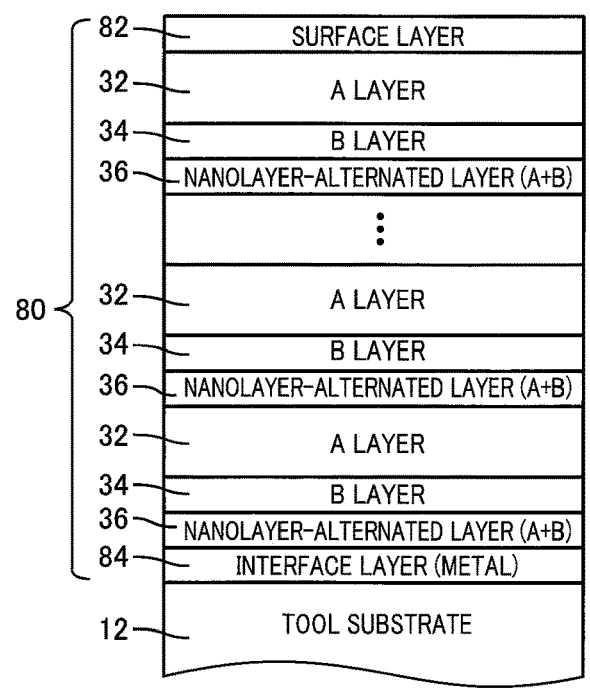
FIG. 8 is a schematic view for explaining still another example of the coating structure of the hard coating that is provided on the ball endmill of FIG. 1.

A hard coating 80 of FIG. 8 is different from the above-described hard coating 30 of FIG. 3 in that a surface layer 82 provides an outermost surface of the hard coating 80 and in that an interface layer 84 is constituted by a composition or compositions that are other the A composition, B composition and C composition. The surface layer 82 is, for example, a nanolayer-alternated layer including the A nanolayer 32$n$ and B nanolayer 34$n$ that are alternately laminated, as the nanolayer-alternated layer 36. The surface layer 82 has a thickness that is appropriately set to a value within a range of 5-1000 nm, and each of the A nanolayer 32$n$ and B nanolayer 34$n$ has a thickness that is appropriately set to a value within a range of 0.5-500 nm. The interface layer 84 is constituted by metal nitride, metal carbonitride or metal carbide, which is constituted by at least one kind of element selected from B, Al, Ti, Y, Zr, Hf, V, Nb, Ta, Cr and W, and has a thickness that is appropriately set to a value within a range of 10-1000 nm.

Further, the hard coating can be constituted in other forms, although not being shown in drawings. For example, the nanolayer-alternated layer 36 of the above-described hard coating 30 includes the A nanolayer 32$n$ and B nanolayer 34$n$ that are alternately laminated. However, the nanolayer-alternated layer 36 may be constructed to include the C nanolayer 52$n$. That is, where the single composition layers are constituted by the A layer 32 and B layer 34, the nanolayer-alternated layer may be constituted by the nanolayer-alternated layer 36 including the A nanolayer 32$n$ and C nanolayer 52$n$ that are alternately laminated, or the nanolayer-alternated layer 36 including the B nanolayer 34$n$ and C nanolayer 52$n$ that are alternately laminated.

Further, the single composition layers are constituted by the A layer 32 and B layer 34 in the hard coating 30, and the single composition layers are constituted by the A layer 32 and C layer 52 in the hard coating 50. However, the two kinds of single composition layers may be constituted by the B layer 34 and C layer 52.

Further, the surface layer 82 of the hard coating 80 is the nanolayer-alternated layer including the A nanolayer 32$n$ and B nanolayer 34$n$ that are alternately laminated. However, the surface layer 82 may be a nanolayer-alternated layer including the C nanolayer 52$n$. Further, the surface layer 82 may be a single composition layer constituted by the A composition, B composition or C composition.

Further, in each of the hard coatings 30, 40, 50, 60, 70, 80, the three kinds of layers, which consist of the two kinds of single composition layers (that are respective two of the A layer 32, B layer 34 and C layer 52) and one of the nanolayer-alternated layers 36, 54, are alternately laminated in a predetermined order for a completed cycle or cycles so that numbers of the respective three kinds of layers are equal to one another. However, the lamination of the three kinds of layers may be terminated without an uppermost or outermost layer of the three kinds of layers completing a corresponding cycle, for example, such that the A layer 32, which provides the uppermost layer of the hard coating 30, is omitted. In other words, also in each of the hard coatings 30, 40, 50, 60, 70 in which the surface layer is not provided, the outermost layer may be regarded as a surface layer other than the three kinds of layers that are alternately laminated. Regarding each of the nanolayer-alternated layers 36, 54 including the two kinds of nanolayers (that are respective two of the A nanolayer 32$n$, B nanolayer 34$n$ and C nanolayer 52$n$) alternately laminated, too, the number of laminated nanolayers may be an odd number, for example, such that the nanolayer-alternated layer 36 is initiated with the A nanolayer 32$n$ and is ended with the A nanolayer 32$n$.

FIG. 13 is a view specifically showing a coating structure of the hard coating of each of test samples 1-50 of endmills. In column of "SINGLE COMPOSITION LAYER", "A LAYER", "B LAYER" and "C LAYER" correspond to the above-described A layer 32, B layer 34 and C layer 52, respectively. Further, in column of "NANOLAYER-ALTERNATED LAYER", "A LAYER", "B LAYER" and "C LAYER" correspond to the above-described A nanolayer 32$n$, B nanolayer 34$n$ and C nanolayer 52$n$, respectively. "INTERFACE LAYER" corresponds to the above-described interface layers 38, 42, 56, 62, 84. Each blank in "A LAYER", "B LAYER" and "C LAYER" in column of "SINGLE COMPOSITION LAYER", "A LAYER", "B LAYER" and "C LAYER" in column of "NANOLAYER-ALTERNATED LAYER", and "INTERFACE LAYER" represents that the corresponding layer is not provided. For example, in the test sample 27 without the interface layer, the single composition layers are the A layer and the C layer, and the nanolayer-alternated layer includes the A nanolayer and the C nanolayer that are alternately laminated, so that components of the B composition described in FIG. 11 are not substantially included in the test sample 27. Further, in the test sample 45 without the interface layer, the single composition layers are the B layer and the C layer, and the nanolayer-alternated layer includes the B nanolayer and the C nanolayer that are alternately laminated, so that components of the A composition described in FIG. 10 are not substantially included in the test sample 45. In each of the other test samples, either, all of components of the A composition, B composition and C composition described in FIGS. 10-12 are not necessarily included, as long as the hard coating is constituted by at least two of the A composition, B composition and C composition. Further, none of the test samples 1-50 shown in FIG. 13 is provided with the surface layer. In FIG. 13, each gray part (column provided with scatter points) represents that a corresponding one of requirements regarding thicknesses of the present embodiment (claim 1 of the present invention) is not satisfied, and the test samples 1-6 are comparative products while the test samples 7-50 are products of the present invention.

Figure 9:
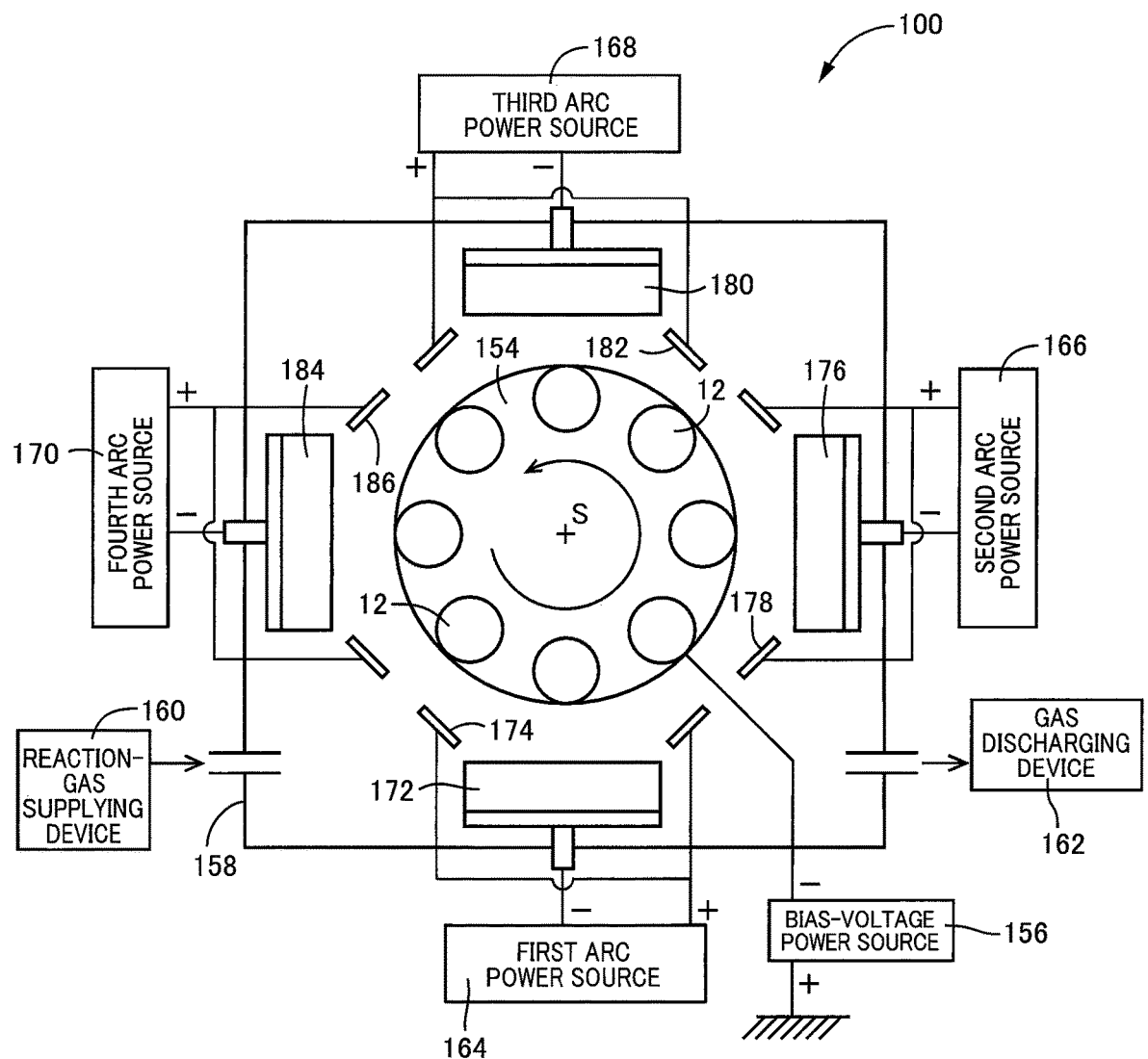
FIG. 9 is a schematic view for explaining an arc ion plating apparatus as an example of a physical vapor deposition apparatus for forming the hard coating of each of FIGS. 3-8 on a tool substrate.

FIG. 9 is a schematic construction view (schematic view) for explaining an arc ion plating apparatus 100 used for forming the above-described hard coatings 30, 40, 50, 60, 70, 80 or the hard coatings of the test samples 1-50 described in FIG. 13 (hereinafter simply referred to "hard coating 30 or the like" where they are not to be distinguished from one another), onto the tool substrate 12. The arc ion plating apparatus 100 is configured to form the hard coating 30 or the like onto the surface of the tool substrate 12 through an arc ion plating as a kind of PVD method, and is capable of continuously forming a plurality of kinds of layers that are different in composition, with predetermined thicknesses, by switching an evaporation source (target) and a reaction gas. For example, when the hard coating 30 is to be formed, the nanolayer-alternated layer 36, B layer 34, and A layer 32 are alternately laminated after the interface layer 38 is formed on the surface of the tool substrate 12. FIG. 9 corresponds to a plane view of the arc ion plating apparatus 100 as seen from an upper side of the arc ion plating apparatus 100.

The arc ion plating apparatus 100 includes: a rotary table 154 to be driven to be rotated about a rotation axis S extending substantially in a vertical direction and to hold a plurality of workpieces, i.e., the plurality of tool substrates 12 on each of which the hard coating 30 or the like is to be formed; a bias-voltage power source 156 for applying a negative bias voltage to the tool substrates 12; a processing vessel in the form of a chamber 158 which accommodates therein the tool substrates 12; a reaction-gas supplying device 160 for supplying a reaction gas into the chamber 158; a gas discharging device 162 for discharging a gas from an interior of the chamber 158 by, for example, a vacuum pump so as to reduce a pressure in the interior of the chamber 158; a first arc power source 164; a second arc power source 166, a third arc power source 168 and a fourth arc power source 170. The rotary table 154 is a disk-shaped table whose center corresponds to the above-described rotation axis S. The plurality of tool substrates 12 are disposed in an outer peripheral portion of the rotary table 154 such that each of the tool substrates 12 has an attitude that causes each substrate 12 is substantially parallel to the rotation S. While the tool substrates 12 are rotated about the rotation axis S by the rotary table 154, each of the tool substrates 12 may be rotated about its axis. When the nitride of the A layer 32, B layer 34, C layer 52 or the like is to be formed, the reaction-gas supplying device 160 supplies nitrogen gas into the chamber 158. An inside of the chamber 158 is placed in a vacuum state of about 2-10 Pa, for example, by the gas discharging device 162, and is heated by a heater or the like not shown in the drawings, to a vapor deposition temperature of about 300-600° C., for example.

Each of the first arc power source 164; second arc power source 166, third arc power source 168 and fourth arc power source 170 is configured to selectively energize between a corresponding one of anodes 174, 178, 182, 186 and a corresponding one of cathodes in the form of first evaporation source 172, second evaporation source 176, third evaporation source 180 and fourth evaporation source 184 that are made of vapor deposition material, with an arc current, so as to cause an arc discharge, thereby selectively causing evaporation material to evaporate from the corresponding one of the first evaporation source 172, second evaporation source 176, third evaporation source 180 and fourth evaporation source 184. After having being evaporated, the evaporation material becomes positive ion that is deposited to cover each of the tool substrates 12 to which negative (−) bias voltage is applied. That is, each of the evaporation sources 172, 176, 180, 184 is constituted by an alloy of one of the A composition, B composition and C composition, so that one of the evaporation sources can serve as an extra source that is constituted by, for example, the alloy of one of the A composition, B composition and C composition, which is to be formed with a relatively large thickness, for thereby making it possible to efficiently perform the coating formation. The number of the evaporation sources may be three so as to correspond to the number of the compositions constituting the hard coating 30 or the like. Further, in a case in which the hard coating 30 or the like is constituted by only two of the A composition, B composition and C composition, the four evaporation sources 172, 176, 180, 184 may be grouped into two groups such that two of the evaporation sources 172, 176, 180, 184 belonging to one of the two groups are constituted by the alloy of one of the two of the A composition, B composition and C composition while the other two of the evaporation sources 172, 176, 180, 184 belonging to the other of the two groups are constituted by the alloy of the other of the two of the A composition, B composition and C composition.

The above-described arc power sources 164, 166, 168, 170 are switched as needed so as to sequentially form the layers of predetermined compositions, whereby the hard coating 30 or the like having a predetermined coating structure can be obtained. The thickness of each layer can be adjusted by controlling a rotational speed of the rotary table 154 and a length of time of energization of a corresponding one or ones of the arc power sources 164, 166, 168, 170. A boundary portion located between a plurality of layers that are different in composition may be provided with a mixture layer constituted by a mixture of two kinds of compositions.

There will be described a result of performance test of the hard coatings, which was made by preparing the test samples 1-50 in which the hard coatings having the respective coating structures shown in FIGS. 10-13 are disposed on a two-teeth ball endmill with the tool substrate 12 made of cemented carbide and with a diameter of 6 mm (nose radius R=3 mm), as in the above-described ball endmill 10. FIG. 14 is a view showing the test result, wherein "COATING HARDNESS" represents a HV value (Vickers hardness) of each hard coating that was measured under a condition indicated by hardness symbol HV0.025, in accordance with Vickers hardness test method (JIS G0202, Z2244). Further, a cutting operation was made by using each of the test samples 1-50, in accordance with a cutting test condition described below, and a cutting distance and a wear width of the relief face (flank face) adjacent to the ball-end cutting edge 20 were measured and a coating performance (wear resistance) was evaluated. The evaluation of the coating performance was made by suspending the cutting operation, basically, in an appropriate stage in which the cutting distance has reached 500 m or more, and then measuring the cutting distance and the wear width of the relief face. In a case in which the wear width of the relief face was enlarged (to 0.3 mm or more), the cutting operation was suspended even with the cutting distance being not longer than 500 m, and the cutting distance and the wear width of the relief face were measured when the cutting operation was suspended. The wear width of the relief face is a maximum width value, and was measured by suspending the cutting operation each time the cutting distance reached to a predetermined distance value, so that the wear width was measured visually by using a measuring microscope (MM-400/LM) manufactured by Nikon Corporation.

(Cutting Test Condition)

Workpiece material: S50C (mechanical structural carbon steel defined by JIS)

Cutting velocity: 254 m/min

Number of revolutions: 13500 $mm^{-1}$

Feed rate: f=0.12 mm/t, F=3240 mm/min
Cutting depth: ap (axial direction)=0.3 mm, ae (radial direction)=0.6 mm As is apparent from FIG. 14, regarding the coating hardness (HV0.025) of the surface, any one of the test samples 7-50 as the products of the present invention exhibited a high hardness value that is 3000 or higher, providing an expectation of excellent wear resistance. Meanwhile, the test samples 1-6 as the comparative products exhibited about 2000-2700 as the hardness value. Regarding the wear width of the relief face and the cutting distance, any one of the test samples 7-50 as the products of the present invention was able to perform the cutting operation over 500 m or more before the wear width of the relief face reached 0.2 mm, and accordingly exhibited excellent wear resistance and excellent welding resistance. Meanwhile, in any one of the test samples 1-6 as the comparative products, the wear width of the relief face exceeded 0.3 mm before the cutting operation over 500 m was completed. In the evaluation, "○" was given to a case in which the cutting operation over 500 m or more was done before the wear width of the relief face reached 0.2 mm, while "x" was given to a case in which the wear width of the relief face exceeded 0.2 mm before the cutting distance reached 500 mm, namely, in which a sufficient tool life was not obtained. In any one of the test samples 7-50 as the products of the present invention, "○" was given in the evaluation result and an excellent tool life was obtained. In the wear width and the cutting distance, each gray part (column provided with scatter points) represents that the wear width of the relief face exceeded 0.2 mm before the cutting distance reached 500 mm.

As described above, in the hard coating 30 or the like of the ball endmill 10 according to the present embodiment, the two kinds of single composition layers, which are constituted by respective two of the A composition, B composition and C composition (i.e., respective two of the A layer 32, B layer 34 and C layer 52), and the one kind of nanolayer-alternated layer (nanolayer-alternated layer 36, 54 or the like) including the two kinds of nanolayers, which are constituted by respective two of the A composition, B composition and C composition (i.e., respective two of the A nanolayer 32n, B nanolayer 34n and C nanolayer 52n) and are alternately laminated, are alternately laminated with predetermined thicknesses, it becomes possible to obtain excellent wear resistance, excellent toughness, excellent lubricity and excellent welding resistance. Owing to these features, it has become possible to increase a service life of the tool in a cutting operation with various workpiece materials such as carbon steel, cast iron, alloy steel and stainless steel, or in a severe machining condition such as high speed machining and dry machining.

Further, since the ratio T1/T2 of the thickness T1 of one of the two kinds of the single composition layers to the thickness T3 of the nanolayer-alternated layer and the ratio T2/T3 of the thickness T2 of the other of the two kinds of the single composition layers to the thickness T3 of the nanolayer-alternated layer are both in range of 0.2-10, the two kinds of single composition layers and the one kind of nanolayer-alternated layer are provided with appropriate thicknesses providing certain characteristics, which make it possible to appropriately obtain performances such as the wear resistance and welding resistance.

Further, each of the hard coating 70 of FIG. 7 and the test samples 27, 45, which is not provided with the interface layer, can be formed at a reduced coating formation cost, and the ball endmill 10 including the hard coating 70 or the like can be manufactured at a cheap cost. On the other hand, each of the hard coatings 30, 40, 50, 60, 80 and the test samples 7-26, 28-44 and 46-50, which is provided with the interface layer 38 or like having the predetermined composition or compositions and the predetermined thickness, it is possible to increase the adhesion strength of the hard coating 30 or the like to the tool substrate 12.

Further, in the hard coating 80 of FIG. 8, which is provided with the surface layer 82 having the predetermined composition or compositions and the predetermined thickness, it is possible to further improve certain coating performances such as the wear resistance and welding resistance, by appropriately determining the composition or compositions and the thickness of the surface layer 82.

Further, the ball endmill 10 is the intermittent cutting tool that is to intermittently perform a cutting operation by the peripheral cutting edge 18 and the ball-end cutting edge 20, so that impact load is repeatedly applied to the peripheral cutting edge 18 and ball-end cutting edge 20 and accordingly the peripheral cutting edge 18 and ball-end cutting edge 20 are easily heated during the cutting operation. However, with provision of the hard coating 30 or the like having high wear resistance, high toughness and high welding resistance, it is possible to increase the service life of the tool.

While the embodiment of the present invention has been described in detail by reference to the accompanying drawings, it is to be understood that the described embodiment is merely an embodied form and that the present invention can be embodied with various modifications and improvements on the basis of knowledge of those skilled in the art.

DESCRIPTION OF REFERENCE SIGNS

10: ball endmill (hard-coating-covered member, intermittent cutting tool), 12: tool substrate (substrate), 18: peripheral cutting edge (cutting edge), 20: ball-end cutting edge (cutting edge), 30, 40, 50, 60, 70, 80: hard coating, 32: A layer (single composition layer), 32n: A nanolayer (nanolayer), 34: B layer (single composition layer), 34n: B nanolayer (nanolayer), 36, 54: nanolayer-alternated layer, 38, 42, 56, 62, 84: interface layer, 52: C layer (single composition layer), 52n: C nanolayer (nanolayer), 82: surface layer, Ttotal: total thickness, T1: thickness of A layer (thickness of single composition layer), T2: thickness of B layer (thickness of single composition layer), T3: thickness of nanolayer-alternated layer

The invention claimed is:

1. A hard coating that is to be adhered to a surface of a substrate so as to cover the surface of the substrate, wherein
the hard coating has a total thickness of a range of 0.5-20 μm and includes three kinds of layers that are alternately laminated, wherein the three kinds of layers consist of two kinds of single composition layers and a nanolayer-alternated layer, wherein the two kinds of single composition layers are constituted by respective two of an A composition, a B composition and a C composition, and wherein the nanolayer-alternated layer includes two kinds of nanolayers which are constituted by respective two of the A composition, the B composition and the C composition and which are alternately laminated;
the A composition is a nitride that is represented by a composition formula of $Al_a\,Cr_b\,\alpha_c$, wherein atomic ratios a, b, c satisfy $0.30 \leq a \leq 0.85$, $0.15 \leq b \leq 0.70$, $0 \leq c \leq 0.10$ and $a+b+c=1$, and wherein an optional additive component $\alpha$ is at least one kind of element selected from B, C, Ti, V, Y, Zr, Nb, Mo, Hf, Ta and W;

the B composition is a nitride that is represented by a composition formula of $Al_d Cr_e Si_f \beta_g$, wherein atomic ratios d, e, f, g satisfy $0.20 \leq d \leq 0.85$, $0.10 \leq e \leq 0.50$, $0.03 \leq f \leq 0.45$, $0 \leq g \leq 0.10$ and $d+e+f+g=1$, and wherein an optional additive component $\beta$ is at least one kind of element selected from B, C, Ti, V, Y, Zr, Nb, Mo, Hf, Ta and W;

the C composition is a nitride that is represented by a composition formula of $Al_h Cr_i (SiC)_j \gamma_k$, wherein atomic ratios h, i, j, k satisfy $0.20 \leq h \leq 0.85$, $0.10 \leq i \leq 0.50$, $0.03 \leq j \leq 0.45$, $0 \leq k \leq 0.10$ and $h+i+j+k=1$, and wherein an optional additive component $\gamma$ is at least one kind of element selected from B, C, Ti, V, Y, Zr, Nb, Mo, Hf, Ta and W;

each of the two kinds of single composition layers has a thickness of a range of 0.5-1000 nm; and each of the two kinds of nanolayers has a thickness of a range of 0.5-500 nm, and the nanolayer-alternated layer has a thickness of a range of 1-1000 nm.

2. The hard coating according to claim 1, wherein a ratio of the thickness of one of the two kinds of the single composition layers to the thickness of the nanolayer-alternated layer and a ratio of the thickness of the other of the two kinds of the single composition layers to the thickness of the nanolayer-alternated layer are both in range of 0.2-10.

3. The hard coating according to claim 1 wherein a lowermost layer of the two kinds of the single composition layers and the nanolayer-alternated layer, which are alternately laminated, is to be disposed directly on a surface of the substrate.

4. The hard coating according to claim 1: wherein
the hard coating includes an interface layer that is to be adjacent to the substrate;
the interface layer has a thickness of a range of 10-1000 nm, and is provided by one of three kinds of layers that are:
a single composition layer constituted by one of the A composition, the B composition and the C composition;
a nanolayer-alternated layer includes two kinds of nanolayers which are constituted by respective two of the A composition, the B composition and the C composition and which are alternately laminated, such that each of the two kinds of nanolayers has a thickness of a range of 0.5-500 nm; and
a layer of metal nitride, metal carbonitride or metal carbide, which is constituted by at least one kind of element selected from B, Al, Ti, Y, Zr, Hf, V, Nb, Ta, Cr and W.

5. The hard coating according to claim 1,: wherein
the hard coating includes a surface layer providing an outermost surface of the hard coating;
the surface layer is provided by a single composition layer constituted by one of the A composition, the B composition and the C composition, or a nanolayer-alternated layer including two kinds of nanolayers which are constituted by respective two of the A composition, the B composition and the C composition and which are alternately laminated such that each of the two kinds of nanolayers has a thickness of a range of 0.5-500 nm; and
the surface layer has a thickness of a range of 5-1000 nm.

6. A hard-coating-covered member including a substrate whose surface is partially or entirely covered with,
the hard coating according to claim 1.

7. The hard-coating-covered member according to claim 6,: wherein
the hard-coating-covered member is an intermittent cutting tool which includes cutting edges and which is to be rotated about an axis so as to perform an intermittent cutting operation by the cutting edges.

* * * * *